United States Patent
Yang

(10) Patent No.: US 8,084,872 B2
(45) Date of Patent: Dec. 27, 2011

(54) OVERLAY MARK, METHOD OF CHECKING LOCAL ALIGMNENT USING THE SAME AND METHOD OF CONTROLLING OVERLAY BASED ON THE SAME

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 847 days.

(21) Appl. No.: 12/166,115

(22) Filed: Jul. 1, 2008

(65) Prior Publication Data

US 2010/0002933 A1 Jan. 7, 2010

(51) Int. Cl.
*G01B 11/00* (2006.01)
*G06K 9/00* (2006.01)

(52) U.S. Cl. .................. 257/797; 257/48; 257/E23.179; 438/14; 382/151; 356/615; 356/620

(58) Field of Classification Search .................. 382/145, 382/152, 151; 356/620, 615; 257/797, E23.179, 257/48; 438/14–18
See application file for complete search history.

(56) References Cited

U.S. PATENT DOCUMENTS

| | | | |
|---|---|---|---|
| 5,808,742 A | 9/1998 | Everett et al. | |
| 6,037,671 A | 3/2000 | Kepler et al. | |
| 6,486,954 B1 | 11/2002 | Mieher et al. | |
| 6,537,713 B2 * | 3/2003 | Yeo | 430/22 |
| 6,921,916 B2 * | 7/2005 | Adel et al. | 257/48 |
| 6,985,618 B2 | 1/2006 | Adel et al. | |
| 7,068,833 B1 | 6/2006 | Ghinovker et al. | |
| 7,075,639 B2 | 7/2006 | Adel et al. | |
| 7,280,212 B2 | 10/2007 | Mieher et al. | |
| 7,427,774 B1 * | 9/2008 | Mantz et al. | 257/48 |
| 7,687,925 B2 * | 3/2010 | Marokkey et al. | 257/797 |
| 2003/0223630 A1 | 12/2003 | Adel et al. | |
| 2008/0122124 A1 * | 5/2008 | Huang et al. | 257/797 |

FOREIGN PATENT DOCUMENTS

| | | |
|---|---|---|
| TW | 348309 | 12/1998 |
| TW | 200707691 | 2/2007 |

* cited by examiner

*Primary Examiner* — Kiesha Bryant
*Assistant Examiner* — Eric Ward
(74) *Attorney, Agent, or Firm* — J.C. Patents

(57) ABSTRACT

An overlay mark is described, including N sets of parallel x-directional linear patterns respectively defined by N ($\geq 2$) exposure steps and N sets of parallel y-directional linear patterns respectively defined by the N exposure steps, and a set of parallel x-directional photoresist bars and a set of parallel y-directional photoresist bars both formed in a lithography process. The N sets of x-directional linear patterns and the set of x-directional photoresist bars are arranged in parallel. The N sets of y-directional linear patterns and the set of y-directional photoresist bars are arranged in parallel.

19 Claims, 3 Drawing Sheets

US 8,084,872 B2

OVERLAY MARK, METHOD OF CHECKING LOCAL ALIGMNENT USING THE SAME AND METHOD OF CONTROLLING OVERLAY BASED ON THE SAME

BACKGROUND OF THE INVENTION

1. Field of the Invention

This invention relates to fabrication of integrated circuits, and more particularly to an overlay mark, to a method of using the overlay mark to check a local alignment between a lower layer defined by N ($\geq 2$) exposure steps and an upper layer, and to a method that is based on use of the overlay mark to control overlay of an upper layer to be defined over a lower layer that has been defined by two exposure steps.

2. Description of the Related Art

To check the overlay accuracy between the patterns of lower and upper wafer layers that is more important as the linewidth gets smaller, a wafer is formed with many overlay marks in its non-die areas. As shown in FIG. 1, on a wafer 10, a plurality of overlay marks 100 are formed at selected positions in the scribe line regions 14 between the dies 12. A conventional overlay mark 100 is the so-called AIM (advanced imaging mark) type overlay mark as shown in FIG. 2.

Referring to FIG. 2, the overlay mark 100 includes 4 adjacent regions 102-108 arranged in a 2×2 array including a first region 102 and a second region 104 arranged diagonally and a third region 106 and a fourth region 108 arranged diagonally, and includes a portion of the lower layer defined by a lithography process for defining the lower layer and a patterned photoresist layer formed in a lithography process defining the upper layer. The portion of the lower layer includes parallel x-directional linear patterns 110 in the first region 102, parallel x-directional linear patterns 112 in the $2^{nd}$ region 104, parallel y-directional linear patterns 114 in the third region 106, and parallel y-directional linear patterns 116 in the fourth region 108. The patterned photoresist layer includes parallel x-directional photoresist bars 118 in the region 102, x-directional photoresist bars 120 in the region 104, parallel y-directional photoresist bars 122 in the region 106, and parallel y-directional photoresist bars 124 in the region 108.

The linear patterns 110-116 and the photoresist bars 118-124 are arranged such that when the upper layer is fully aligned to the lower one, the central line of respective central lines of the x-directional linear patterns 110 and the x-directional linear patterns 112 coincides with that of respective central lines of the x-directional photoresist bars 118 and the x-directional photoresist bars 120, and the central line of respective central lines of the y-directional linear patterns 114 and the y-directional linear patterns 116 coincides with that of respective central lines of the y-directional photoresist bars 122 and the y-directional photoresist bars 124.

To check a local alignment at the position where an overlay mark 100 is formed, the y-coordinate "$y_{1a}$" of the central line of the x-directional linear patterns 110 of the overlay mark 100, the y-coordinate "$y_{1b}$" of the central line of the x-directional linear patterns 112, the x-coordinate "$x_{1a}$" of the central line of the y-directional linear patterns 114, the x-coordinate "$x_{1b}$" of the central line of the y-directional linear patterns 116, the y-coordinate "$y_{2a}$" of the central line of the x-directional photoresist bars 118, the y-coordinate "$y_{2b}$" of the central line of the x-directional photoresist bars 120, the x-coordinate "$x_{2a}$" of the central line of the y-directional photoresist bars 122 and the x-coordinate "$x_{2b}$" of the central line of the y-directional bars 124 are derived at first.

The method of deriving the x- and y-coordinates is exemplified by the following process of deriving $x_{1a}$ that is shown in FIG. 1. The y-directional linear patterns 114 are scanned by a light beam in the direction 130 to obtain a reflectivity curve 140, and respective x-coordinates of the y-directional linear patterns 114 are determined based on the reflectivity curve 140. When the linear patterns 110-116 are, for example, trenches in the lower layer, $x_{1a}$ is calculated as the average of the x-coordinates $x_{1a1}, x_{1a2}, x_{1a3}, x_{1a4}, x_{1a5}$ and $x_{1a6}$ of the six minimal points of the reflectivity curve 140.

Then, the x-directional local alignment error between the upper and lower layers at the position of the overlay mark is calculated as "$(x_{2a}+x_{2b})/2-(x_{1a}+x_{1b})/2$", and the y-directional local alignment error is calculated as "$(y_{2a}+y_{2b})/2-(y_{1a}+y_{1b})/2$". After the x- and y-directional local alignment errors at different wafer positions are determined with the overlay marks thereat, various types of overlay errors, such as X-translational error, Y-translational error, rotational error and magnification error, can be derived from the data of the local alignment errors, and the exposure device is adjusted to compensate the overlay errors for more accurate definition of the upper layer on the later wafers.

Moreover, when the lower layer is defined by two or three exposure steps, in the prior art, two or three above overlay marks are formed at one wafer position for the two or three exposure steps, so that x- and y-directional local alignments of the upper layer to a portion of the lower layer defined by any one of the exposure steps can be checked. Thus, a double or triple area is required to form the overlay marks.

SUMMARY OF THE INVENTION

In view of the foregoing, this invention provides an overlay mark that is applied to an integrated circuit (IC) manufacturing process including N ($\geq 2$) exposure steps for defining a lower layer and a lithography process for defining an upper layer, allowing the number of overlay marks required to be 1/N of that required in the prior art.

This invention also provides a method of checking a local alignment between a lower layer defined by N ($\geq 2$) exposure steps and an upper layer defined by a later lithography process, which utilizes an overlay mark of this invention.

This invention also provides a method of controlling overlay of an upper layer over a lower layer defined by a first exposure step and a second exposure step.

The overlay mark of this invention includes N ($\geq 2$) sets of parallel x-directional linear patterns respectively defined by the N exposure steps and N sets of parallel y-directional linear patterns respectively defined by the N exposure steps, and a set of parallel x-directional photoresist bars and a set of parallel y-directional photoresist bars both formed in a lithography process. The N sets of x-directional linear patterns and the set of x-directional photoresist bars are arranged in parallel and the N sets of y-directional linear patterns and the set of y-directional photoresist bars arranged in parallel.

The method of checking a local alignment of this invention is described below. An above overlay mark of this invention is provided. For each set of the N sets of x-directional linear patterns, the N sets of y-directional linear patterns, the set of x-directional photoresist bars and the set of y-directional photoresist bars, the central y- or x-coordinate as the average of the y- or x-coordinates of the set of x- or y-directional linear patterns or photoresist bars is derived. For each pair of co-directional sets among all the sets of linear patterns and photoresist bars, respective central y- or x-coordinates of the co-directional sets are compared to inspect the y- or x-directional local alignment between two portions of the lower layer respectively defined by two of the N exposure steps or between the upper layer and a portion of the lower layer defined by one of the N exposure steps.

The method of controlling overlay of this invention is described below. The overlay between the lower layer and the upper layer is checked using a plurality of overlay marks of this invention of N=2.

In the overlay control method of this invention, each overlay mark includes a first set of parallel x-directional linear patterns, a first set of parallel y-directional linear patterns, a second set of parallel x-directional linear patterns, a second set of parallel y-directional linear patterns, a set of parallel x-directional photoresist bars and a set of parallel y-directional photoresist bars. The first sets of x-directional linear patterns and y-directional linear patterns are defined by the first exposure step. The second sets of x-directional linear patterns and y-directional linear patterns are defined by the second exposure step. The sets of x-directional photoresist bars and y-directional photoresist bars are both formed in the lithography process defining the upper layer. The first set of x-directional linear patterns, the second set of x-directional linear patterns and the set of x-directional photoresist bars are arranged in parallel. The first set of y-directional linear patterns, the second set of y-directional linear patterns and the set of y-directional photoresist bars are arranged in parallel.

In the overlay control method of this invention, the overlay checking includes the following steps. For each overlay mark, a first central y-coordinate as an average of y-coordinates of the first set of x-directional linear patterns, a second central y-coordinate as an average of y-coordinates of the second set of x-directional linear patterns, a third central y-coordinate as an average of y-coordinates of the set of x-directional photoresist bars, a first central x-coordinate as an average of x-coordinates of the first set of y-directional linear patterns, a second central x-coordinate as an average of x-coordinates of the second set of y-directional linear patterns and a third central x-coordinate as an average of x-coordinates of the set of y-directional photoresist bars are derived. For each overlay mark, a first difference between the first central y-coordinate and the third central y-coordinate, a second difference between the first central x-coordinate and the third central x-coordinate, a third difference between the second central y-coordinate and the third central y-coordinate and a fourth difference between the second central x-coordinate and the third central x-coordinate are calculated. From the first and the second differences, a first set of overlay errors of multiple types between the upper layer and a portion of the lower layer defined by the first exposure step is derived. From the third and the fourth differences, a second set of overlay errors of the multiple types between the upper layer and a portion of the lower layer defined by the second exposure step is derived.

In an embodiment, the overlay errors derived as above are compensated for a third exposure step in the lithography process defining the upper layer. In each pair of overlay errors of the same type in the first and second sets of overlay errors, a first overlay error correlated with the first exposure step can be compensated by a first compensation value C1 in the third exposure step and a second overlay error correlated with the second exposure step can be compensated by a second compensation value C2 in the third exposure step. Each pair of overlay errors of the same type is compensated with a first weight "w" (w<1) and a second weight "(1−w)" respectively applied to the first compensation value C1 and to the second compensation value C2 so that a weighted compensation value of "C1×w+C2×(1−w)" is applied for the pair of overlay errors in the third exposure step.

Since an overlay mark of this invention includes N parts respectively defined by the N exposure steps, a local alignment between the upper layer and a portion of the lower layer defined by any of the N exposure steps can be checked with only one of the overlay mark. Thereby, the number of overlay marks required or the area required for forming overlay marks can be reduced to 1/N of that required in the prior art. Also, a local alignment between two portions of the lower layer respectively defined by any two of the N exposure steps can be checked, too.

It is noted that both the foregoing general description and the following detailed description are just exemplary, and are intended to provide further explanation of the invention as claimed.

BRIEF DESCRIPTION OF THE DRAWINGS

FIG. 3 illustrates a modified version of the overlay mark.

DESCRIPTION OF THE PREFERRED EMBODIMENTS

It is noted that the following embodiments and examples are intended to further explain this invention but not to limit the scope of this invention.

Figure 3:
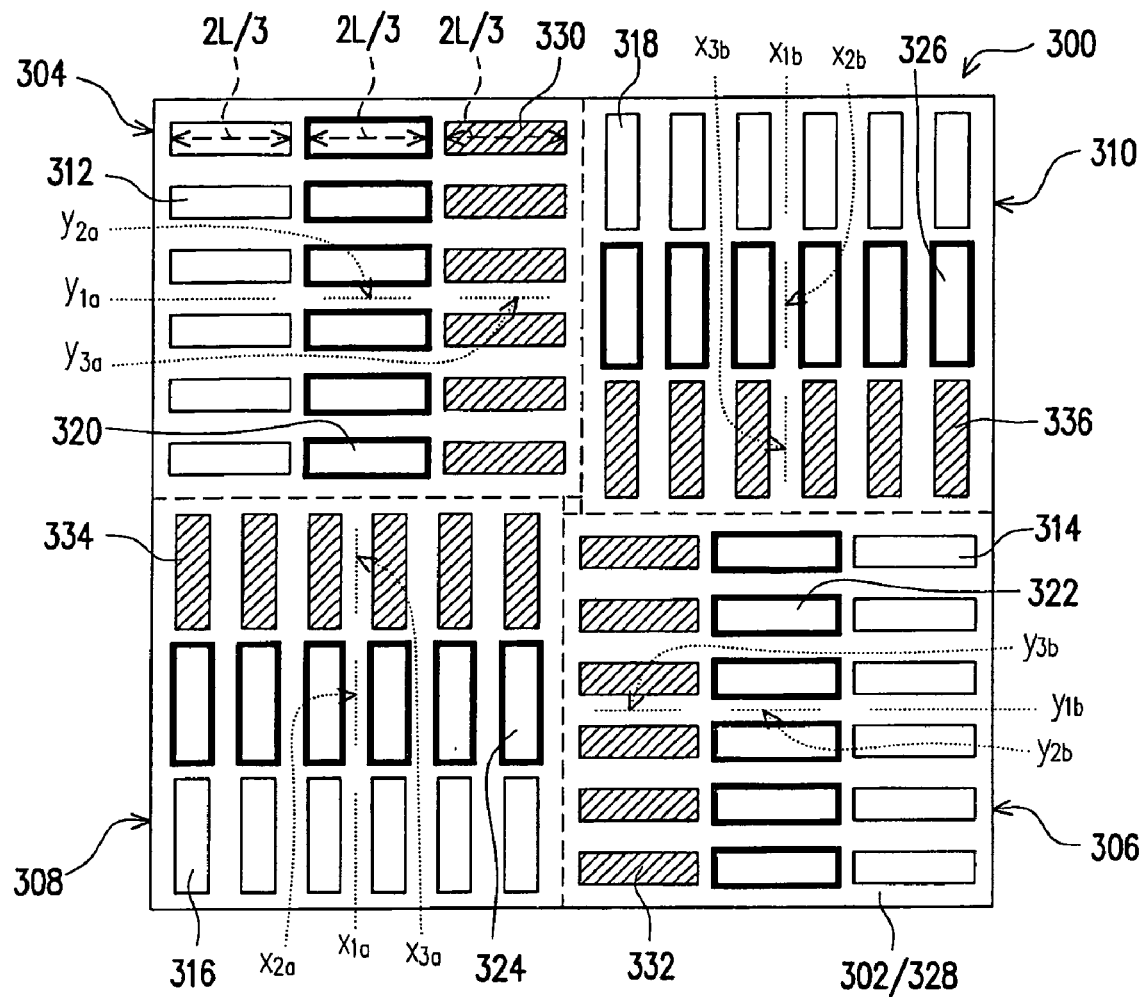
FIG. 3 illustrates an overlay mark of N=2 according to a first embodiment of this invention.
Figure 3:
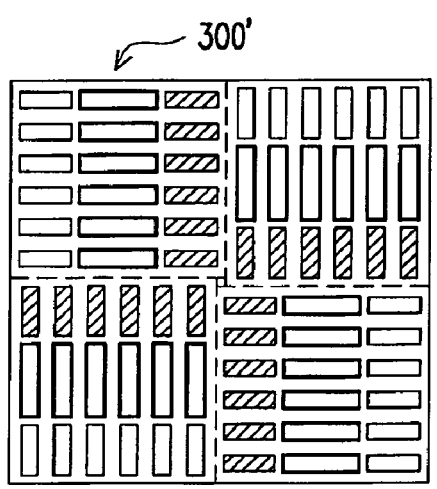

FIG. 3 illustrates an overlay mark of N=2 according to the first embodiment of this invention that is applied to a case where the lower layer is defined by two exposure steps, while FIG. 3' illustrates a modified version of the overlay mark.

The overlay mark 300 includes a portion of a lower layer 302 having trenches therein or a portion of a lower layer as line patterns on a substrate 302, and a patterned photoresist layer formed in a lithography process defining the upper layer. The area of the overlay mark 300 is divided into four adjacent regions 304-310, which are arranged in a 2×2 array including a first region 304 and a second region 306 arranged diagonally as well as a third region 308 and a fourth region 310 arranged diagonally.

The portion of the lower layer (302) includes a first part of a first set of parallel x-directional linear patterns 312 in the first region 304, a second part of the first set of parallel x-directional linear patterns 314 in the second region 306, a first part of a first set of parallel y-directional linear patterns 316 in the third region 308, a second part of the first set of parallel y-directional linear patterns 318 in the fourth region 310, a first part of a second set of parallel x-directional linear patterns 320 in the first region 304, a second part of the second set of parallel x-directional linear patterns 322 in the second region 306, a first part of a second set of parallel y-directional linear patterns 324 in the third region 308, and a second part of the second set of parallel y-directional linear patterns 326 in the fourth region 310.

All the linear patterns 312-326 are covered by the upper layer 328 that is to be defined by the patterned photoresist layer. The patterned photoresist layer includes a first part of parallel x-directional photoresist bars 330 in the rest of the first region 304, a second part of parallel x-directional photoresist bars 332 in the rest of the second region 306, a first part of parallel y-directional photoresist bars 334 in the rest of the third region 308, and a second part of parallel y-directional photoresist bars 336 in the rest of the fourth region 310.

The first set of x-directional linear patterns 312 and 314 and the first set of y-directional linear patterns 316 and 318 are defined by the first exposure step and disposed in the outer portions of the regions 304-310. The second set of x-directional linear patterns 320 and 322 and the second set of y-directional linear patterns 324 and 326 are defined by the second exposure step and disposed in the middle portions of the regions 304-310. The x-directional photoresist bars 330 and 332 and y-directional photoresist bars 334 and 336 are defined by the lithography process for defining the upper layer 328 and disposed in the inner portions of the regions 304-310.

The first part of the first set of x-directional linear patterns 312, the first part of the second set of x-directional linear patterns 320 and the first part of the set of x-directional photoresist bars 330 are arranged in parallel in the first region 304. The second part of the first set of x-directional linear patterns 314, the second part of the second set of x-directional linear patterns 322 and the second part of the set of x-directional photoresist bars 332 arranged in parallel in the second region 306. The first part of the first set of y-directional linear patterns 316, the first part of the second set of y-directional linear patterns 324 and the first part of the set of y-directional photoresist bars 334 are arranged in parallel in the third region 308. The second part of the first set of y-directional linear patterns 318, the second part of the second set of y-directional linear patterns 326 and the second part of the set of y-directional photoresist bars 336 are arranged in parallel in the fourth region 310.

It is possible that the first set of x-directional linear patterns 312/314, the second set of x-directional linear patterns 320/322 and the set of x-directional photoresist bars 330/332 evenly share the area of the first/second region 304/306 to have substantially the same width and the first set of y-directional linear patterns 316/318, the second set of y-directional linear patterns 324/326 and the set of y-directional photoresist bars 334/336 evenly share the area of the third/fourth region 308/310 to have substantially the same width. In such a case the width may be "2L/3" when the width of each set of parallel linear patterns or photoresist bars in the prior art is "L" as illustrated in FIG. 2.

It is also possible that the above three sets of x-directional linear patterns and photoresist bars have at least two different widths and the above three sets of y-directional linear patterns and photoresist bars have at least two different widths. FIG. 3, illustrates such an over layer mark 300' where the three sets of x- or y-directional linear patterns and photoresist bars have two different widths.

The y-coordinate of the central line of the x-directional linear patterns 312/314 is denoted by "$y_{1a}$"/"$y_{1b}$". The x-coordinate of the central line of the y-directional linear patterns 316/318 is denoted by "$x_{1a}$"/"$x_{1b}$". The y-coordinate of the central line of the x-directional linear patterns 320/322 is denoted by "$y_{2a}$"/"$y_{2b}$". The x-coordinate of the central line of the y-directional linear patterns 324/326 is denoted by "$x_{2a}$"/"$x_{2b}$". The y-coordinate of the central line of the x-directional photoresist bars 330/332 is denoted by "$y_{3a}$"/"$y_{3b}$". The x-coordinate of the central line of the y-directional photoresist bars 334/336 is denoted by "$x_{3a}$"/"$x_{3b}$". The x-directional and y-directional linear patterns 312-326 and the x-directional and y-directional photoresist bars 330-336 are arranged such that when the two portions of the lower layer (302) respectively defined by the two exposure steps are fully aligned with each other and the exposure step for defining the upper layer 328 is fully aligned with both of the two portions of the lower layer (302), $(y_{1a}+y_{1b})/2$, $(y_{2a}+y_{2b})/2$ and $(y_{3a}+y_{3b})/2$ are equal to each other and $(x_{1a}+x_{1b})/2$, $(x_{2a}+x_{2b})/2$ and $(x_{3a}+x_{3b})/2$ are equal to each other.

Figure 2:
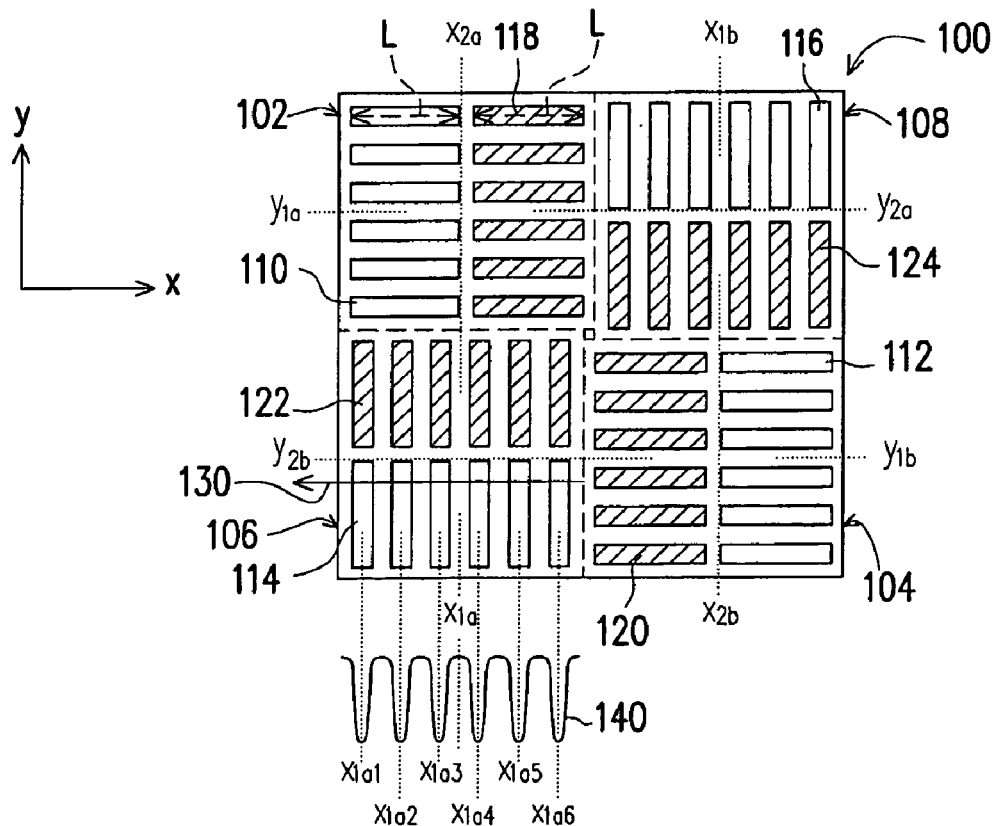
FIG. 2 illustrates a conventional AIM-type overlay mark in the prior art, and also exemplifies a method of deriving the central x- or y-coordinate of a set of parallel y- or x-directional linear patterns or photoresist bars.

Accordingly, to check all of the x-directional and y-directional local alignments between the two portions of the lower layer (302) respectively defined by the two exposure steps and between the upper layer 328 and respective ones of the two portions of the lower layer (302) at the position of the overlay mark 300, each of the coordinates $y_{1a}$, $y_{1b}$, $y_{2a}$, $y_{2b}$, $y_{3a}$, $y_{3b}$, $x_{1a}$, $x_{1b}$, $x_{2a}$, $x_{2b}$, $x_{3a}$ and $x_{3b}$ is derived possibly with a method similar to the method illustrated in FIG. 2, respective values of $(y_{1a}+y_{1b})/2$, $(y_{2a}+y_{2b})/2$, $(y_{3a}+y_{3b})/2$, $(x_{1a}+x_{1b})/2$, $(x_{2a}+x_{2b})/2$ and $(x_{3a}+x_{3b})/2$ are calculated, and then the three y-coordinates obtained are compared with each other and the three x-coordinates obtained are compared with each other. For example, the x-directional local alignment error between the two portions of the lower layer (302) respectively defined by the two exposure steps is equal to "$(x_{2a}+x_{2b})/2-(x_{1a}+x_{1b})/2$", and the x-directional local alignment error between the upper layer 328 and a portion of the lower layer (302) defined by the first exposure step is equal to "$(x_{3a}+x_{3b})/2-(x_{1a}+x_{1b})/2$".

It is also possible to pick one or more (not all) pairs of co-directional sets among the first set of x-directional linear patterns 312 and 314, the second set of x-directional linear patterns 320 and 322, the first set of y-directional linear patterns 316 and 318, the second set of y-directional linear patterns 324 and 326, the set of x-directional photoresist bars 330 and 332 and the set of y-directional photoresist bars 334 and 336, derive the central coordinate of the y- or x-coordinates of each set of x- or y-directional linear patterns or photoresist bars in the one pair or each pair of co-directional sets, and calculate, for each set in the one pair or each pair of co-directional sets, a x-directional or y-directional local alignment error between the two portions of the lower layer (302) respectively defined by the two exposure steps, or between the upper layer and a portion of the lower layer (302) defined by the first or second exposure step, at the position of the overlay mark 300.

Figure 1:
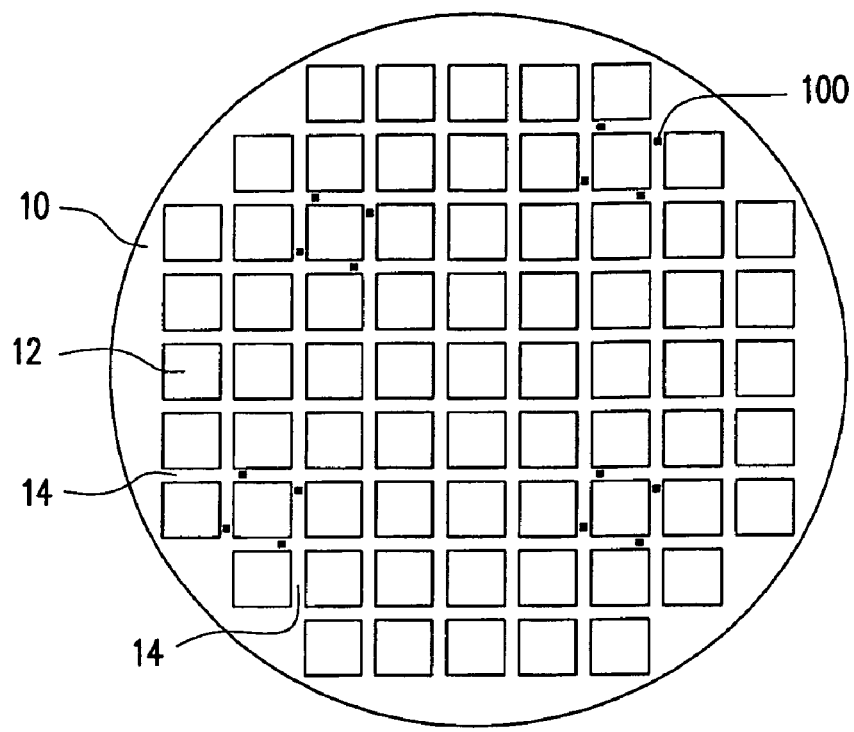
FIG. 1 illustrates a wafer with a number of overlay marks formed thereon.

Moreover, to derive various type of overlay errors, such as X-translational error, Y-translational error, rotational error, magnification error and so forth, between the upper layer and respective ones of the two portions of the lower layer (302) respectively defined by the two exposure steps for the later compensation by the exposure apparatus in patterning the upper layer 328 on subsequent wafers, all the x- and y-directional local alignment errors between the lower layer (302) and the upper layer 328 at the position of each overlay mark 300 have to be derived, and the alignment data of all the overlay marks 300 distributed over the wafer are required. The overlay marks 300 may be distributed in a manner similar to that illustrated in FIG. 1 (overlay marks 100).

Specifically, for each overlay mark 300, respective values of $(y_{3a}+y_{3b})/2-(y_{1a}+y_{1b})/2$, $(y_{3a}+y_{3b})/2-(x_{2a}+y_{2b})/2$, $(x_{3a}+x_{3b})/2-(x_{1a}+x_{1b})/2$ and $(x_{3a}+x_{3b})/2-(x_{2a}+x_{2b})/2$ are calculated respectively as the y-directional local alignment error between the upper layer 328 and a portion of the lower layer (302) defined by the first exposure step, the y-directional local alignment error between the upper layer 328 and a portion of the lower layer (302) defined by the second exposure step, the x-directional local alignment error between the upper layer 328 and a portion of the lower layer (302) defined by the first exposure step and the x-directional local alignment error between the upper layer 328 and a portion of the lower layer (302) defined by the second exposure step.

After the data of the above differences of all of the overlay marks 300 on the wafer are collected, a first set of overlay errors of the various types between the upper layer 328 and the portion of the lower layer (302) defined by the first exposure step can be derived based on the values of $(y_{3a}+y_{3b})/2-(y_{1a}+y_{1b})/2$ and $(x_{3a}+x_{3b})/2-(x_{1a}+x_{1b})/2$ and certain formulae for fitting. The formulae applicable to the fitting can be readily found in the prior art, such as U.S. Pat. No. 7,280,212, and are therefore not described in details here. Similarly, a second set of overlay errors of the same types between the upper layer 328 and the portion of the lower layer (302) defined by the second exposure step can be derived based on the values of $(y_{3a}+y_{3b})/2-(y_{2a}+y_{2b})/2$ and $(x_{3a}+x_{3b})/2-(x_{2a}+x_{2b})/2$ and the same formulae for fitting.

After the first and second sets of overlay errors of the various types are derived, the exposure apparatus used in a third exposure step in the lithography process defining the upper layer can be adjusted to compensate each pair of overlay errors of the same type in the first and second sets of overlay errors, possibly in a weighted manner as described below. In each pair of overlay errors of the same type in the first and second sets of overlay errors, a first overlay error correlated with the first exposure step can be compensated by a first compensation value C1 in the third exposure step and a second overlay error correlated with the second exposure step can be compensated by a second compensation value C2 in the third exposure step. Each pair of overlay errors of the same type is compensated with a first weight "w" (w<1) and a second weight "(1−w)" respectively applied to the first compensation value C1 and to the second compensation value C2 so that a weighted compensation value of "C1×w+C2×(1−w)" is applied for the pair of overlay errors in the third exposure step.

The value of w may be set as 0.5, or alternatively set greater or less than 0.5 possibly according to a first overlay specification (OS1) of the upper layer to the lower layer defined by the first exposure step and a second overlay specification (OS2) of the upper layer to the lower layer defined by the second exposure step. In such a case, among the two weights "w" and "(1−w)", the one corresponding to a relatively tighter overlay specification with a relatively smaller value is larger than the other. It is possible that w=(OS2)/(OS1+OS2) and 1−w=(OS1)/(OS1+OS2).

For example, when OS1=20 nm and OS2=30 nm and the compensation value of the exposure apparatus required for the X-translational error of the exposure step of the upper layer relative to the portion of the lower layer defined by the first/second exposure step is 50/30 nm, the value of w correlated with the first exposure step can be set at 0.6 (=30/(20+30)) and the weighted compensation value practically applied for the overall X-translational error is 50 nm×0.6+30 nm×(1−0.6)=42 nm.

Analogously, when the lower layer is defined by three exposure steps, additional x-directional and y-directional linear patterns can be added to the overlay mark so that the local alignments between the three portions of the lower layer respectively defined by the three exposure steps and between the exposure step for defining the upper layer and respective ones of the three portions of the lower layer can be checked.

Figure 4:
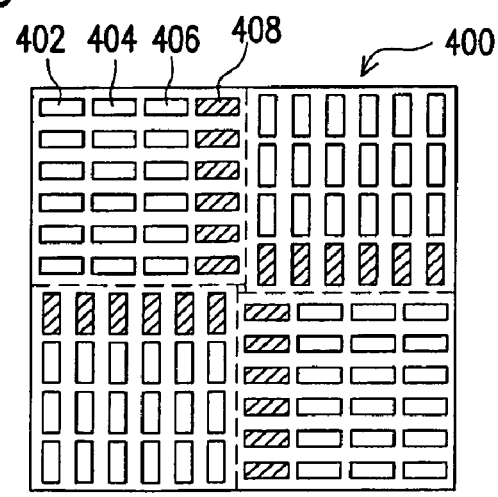
FIG. 4 illustrates an overlay mark of N=3 according to the second embodiment of this invention.

FIG. 4 illustrates such an overlay mark 400 of N=4 according to the second embodiment of this invention. The four sets of outmost x-directional and y-directional linear patterns 402 are defined by the first one of the three exposure steps. The four sets of x-directional and y-directional linear patterns 404 are defined by the second one of the three exposure steps. The four sets of x-directional and y-directional linear patterns 406 are defined by the third one of the three exposure steps, and the four sets of x-directional and y-directional photoresist bars 408 are defined by the exposure step for defining the upper layer. It is noted that the three exposure steps may belong to one lithography process or belong to three lithography processes respectively.

The above overlay mark 300 can be applied to a case where the two exposure steps defining the lower layer belong to the same lithograph process with different photomasks, or to a case where the two exposure steps respectively belong to two lithograph processes wherein two photoresist layers are formed and patterned. When the two exposure steps belong to the same lithograph process, they constitute a so-called double exposure process. Two examples of the above two cases are described below.

Figure 5A:
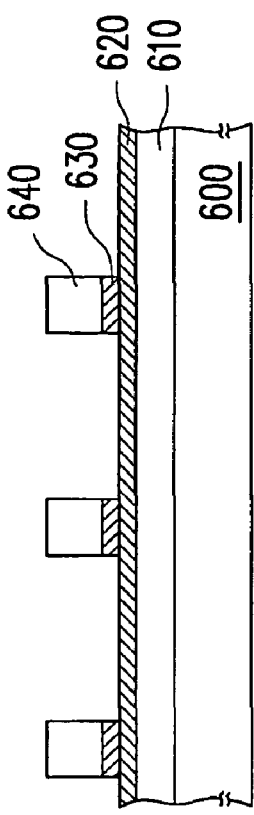
FIGS. 5A-5C illustrate a trench patterning method including a double exposure process to which the overlay mark of this invention is suitably applied.
Figure 5B:
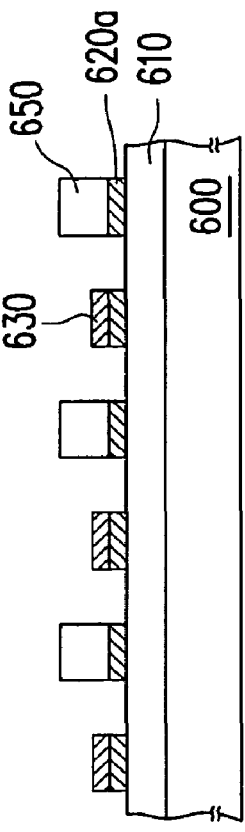
Figure 5C:
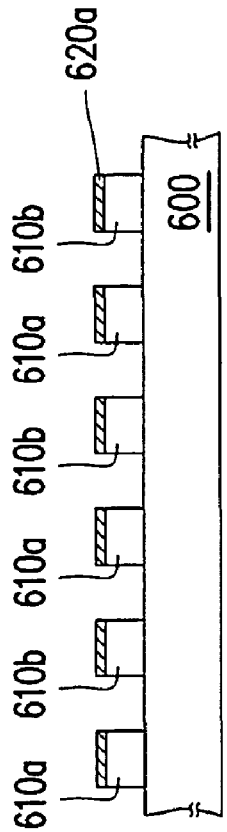

FIGS. 5A-5C illustrate a trench patterning method including a double exposure process to which the overlay mark of this invention is suitably applied. The trench patterning method is suitably applied to a case where formation of target trench patterns requires a pitch resolution higher than that can be achieved in one exposure step.

Referring to FIG. 5A, after a lower layer 510 and a positive photoresist layer 520 are sequentially formed on a substrate 500, a first exposure step using a first photomask 530 with openings therein is performed to form exposed portions 520a in the positive photoresist layer 520. Please also referring to FIG. 3, the definitions of the first set of x-directional linear patterns 312/314 as trench patterns and the first set of y-directional linear patterns 316/318 as trench patterns are also done in the first exposure step with certain patterns in a non-device area (not shown) of the first photomask 530.

Referring to FIG. 5B, a second exposure step using a second photomask 540 with openings of different positions therein is performed to form additional exposed portions 520b in the positive photoresist layer 520 between the exposed portions 520a formed previously. The definitions of the second set of x-directional linear patterns 320/322 as trench patterns and the second set of y-directional linear patterns 324/326 as trench patterns are also done in the second exposure step with certain patterns in the corresponding non-device area (not shown) of the photomask 540.

Referring to FIG. 5C, after the exposed portions 520a and 520b are removed in a subsequent development step, the lower layer 510 is etch-patterned using the patterned photoresist layer 520c as a mask to form therein a plurality of trenches 512a defined by the first exposure step and a plurality of trenches 512b defined by the second exposure step that are arranged alternately. Meanwhile, the above linear patterns 312-326 of the overlay mark 300 are formed as trenches in a non-device portion (not shown) of the lower layer 510.

Figure 6A:
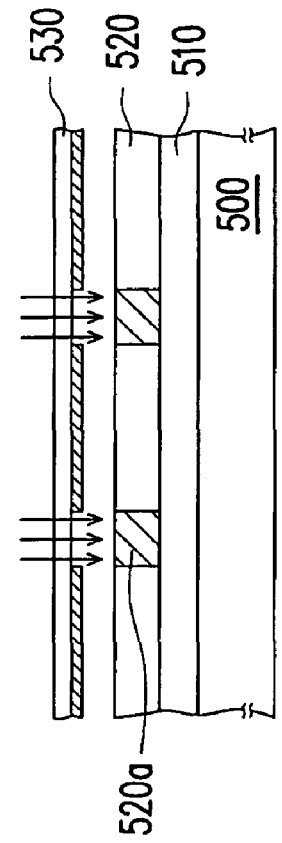
FIGS. 6A-6C illustrate a line patterning method including two exposure steps respectively belonging to two lithography processes, to which the overlay mark of this invention is suitably applied.
Figure 6B:
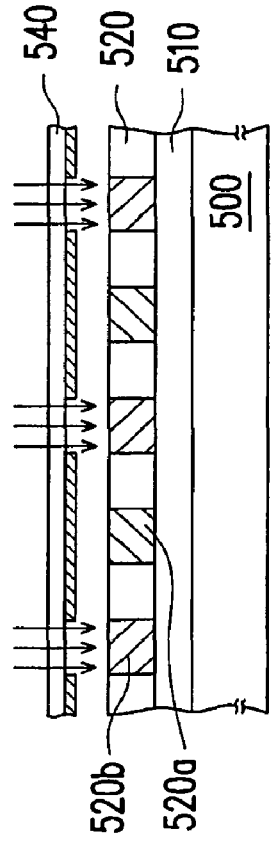
Figure 6C:
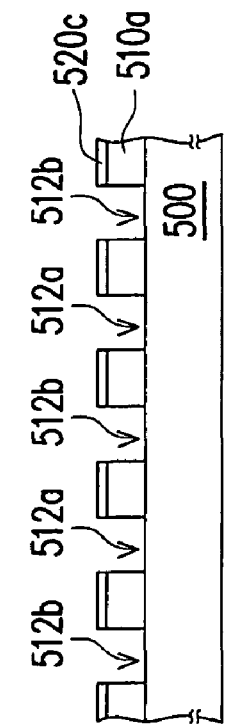

FIGS. 6A-6C illustrate a line patterning method including two exposure steps respectively belonging to two lithography processes, to which the overlay mark of this invention is suitably applied. The line patterning method is suitably applied to a case where formation of target line patterns requires a pitch resolution higher than that can be achieved in one exposure step.

Referring to FIG. 6A, after a lower wafer layer 610, a first hard mask layer 620 and a second hard mask layer 630 are sequentially formed on a substrate 600, a first lithography process including the first exposure step is performed to form a patterned photoresist layer 640 having a plurality of line patterns. The second hard mask layer 630 is then etched to form a plurality of corresponding line patterns with the photoresist layer 640 as a mask. The definitions of the first set of x-directional linear patterns 312/314 and the first set of y-directional linear patterns 316/318 as line patterns are also done in the first lithography process with certain patterns in a non-device area of the photomask used.

Referring to FIG. 6B, after the photoresist layer 640 is removed, a second lithograph process including the second exposure step is done to form another patterned photoresist layer 650 having a plurality of line patterns arranged alternately with the line patterns of the second hard mask layer 630. The first hard mask layer 620 is then etched using the patterned photoresist layer 650 and the second hard mask layer 630 as a mask to form a patterned hard mask layer 620a that includes a plurality line patterns with a smaller pitch. The definitions of the second set of x-directional linear patterns 320/322 and the second set of y-directional linear patterns 324/326 as line patterns are also done in the second lithography process with certain patterns in a non-device area of the photomask used.

Referring to FIG. 6C, the lower wafer layer 610 is etched using the patterned first hard mask layer 620a, the patterned second hard mask layer 630 and the patterned photoresist layer 650 as a mask to form a plurality of line patterns 610a defined by the first exposure step and a plurality of lines patterns 610b defined by the second exposure step that are arranged alternately. Meanwhile, the above linear patterns 312-326 of the overlay mark 300 are formed as line patterns from a portion of the lower layer 610 in a non-device area (not shown).

Further, the above process is a good example for explaining the overlay control method of the invention that features application of the same weight or different weights to the compensation values for the overlay errors respectively correlated with the two exposure steps for defining the same lower layer.

In such an example, the line patterns 610a and 610b as the patterns of the lower layer are conductive lines, to which contact plugs will be connected through a dielectric layer as the upper layer. To lower the possibility of circuit failure in the product, the overlay errors of the corresponding contact hole patterns in the dielectric layer over the line patterns 610a and those of the corresponding contact hole patterns in the dielectric layer over the line patterns 610b on an inspected wafer have to be compensated at the same time by adjusting the exposure apparatus to be used to define contact hole patterns in the dielectric layer on the subsequent wafers having formed with the line patterns 610a and 610b thereon.

When the first overlay specification OS1 of the dielectric layer to the line patterns 610a defined by the first exposure step is substantially the same as the second overlay specification OS2 of the dielectric layer to the line patterns 610b defined by the second exposure step, the weight w correlated with the first exposure step can be set at 0.5. When the first overlay specification is tighter or looser than the second overlay specification (OS1 is smaller or larger than OS2), the weight w correlated with the first exposure step can be set greater or smaller than 0.5, possibly equal to OS2/(OS1+ OS2).

Since an overlay mark of this invention includes N parts respectively defined by the N exposure steps, a local alignment between the upper layer and a portion of the lower layer defined by any of the N exposure steps can be checked with only one of the overlay mark. Thereby, the number of overlay marks required or the area required for forming overlay marks can be reduced to 1/N of that required in the prior art. Also, a local alignment between two portions of the lower layer respectively defined by any two of the N exposure steps can be checked, too.

This invention has been disclosed above in the embodiments, but is not limited to those. It is known to persons skilled in the art that some modifications and innovations may be made without departing from the spirit and scope of this invention. Hence, the scope of this invention should be defined by the following claims.

What is claimed is:

1. An overlay mark, comprising:
   four regions that are arranged in a 2×2 array, and include a first region and a second region arranged diagonally and a third region and a fourth region arranged diagonally;
   N ($\geq$2) sets of parallel x-directional linear patterns respectively defined by N exposure steps and N sets of parallel y-directional linear pattern respectively defined by the N exposure steps; and
   a set of parallel x-directional photoresist bars and a set of parallel y-directional photoresist bars that are both formed in a lithography process,
   wherein
   the N sets of x-directional linear patterns and the set of x-directional photoresist bars are arranged in parallel,
   the N sets of y-directional linear patterns and the set of y-directional photoresist bars are arranged in parallel,
   each set of x-directional linear patterns includes a first part of x-directional linear patterns and a second part of x-directional linear patterns,
   each set of y-directional linear patterns includes a first part of y-directional linear patterns and a second part of y-directional linear patterns,
   the set of x-directional photoresist bars includes a first part of x-directional photoresist bars and a second part of x-directional photoresist bars,
   the set of y-directional photoresist bars includes a first part of y-directional photoresist bars and a second part of y-directional photoresist bars,
   the first parts of x-directional linear patterns of the N sets of x-directional linear patterns and the first part of x-directional photoresist bars are disposed in the first region,
   the second parts of x-directional linear patterns of the N sets of x-directional linear patterns and the second part of x-directional photoresist bars are disposed in the second region,
   the first parts of y-directional linear patterns of the N sets of y-directional linear patterns and the first part of y-directional photoresist bars are disposed in the third region, and
   the second parts of y-directional linear patterns of the N sets of y-directional linear patterns and the second part of y-directional photoresist bars are disposed in the fourth region.

2. The overlay mark of claim 1, wherein the N exposure steps belong to another lithography process.

3. The overlay mark of claim 2, wherein N is equal to 2 so that the N exposure steps constitute a double exposure process, or N is equal to 3.

4. The overlay mark of claim 1, wherein the N exposure steps respectively belong to N other lithography processes.

5. The overlay mark of claim 4, wherein N is equal to 2 or 3.

6. The overlay mark of claim 1, wherein each set of x-directional linear patterns has a width substantially the same as a width of the set of x-directional photoresist bars, and each set of y-directional linear patterns has a width substantially the same as a width of the set of y-directional photoresist bars.

7. The overlay mark of claim 1, wherein the sets of x-directional linear patterns and the set of x-directional photoresist bars have at least two different widths, and the sets of y-directional linear patterns and the set of y-directional photoresist bars have at least two different widths.

8. A method of checking a local alignment between a lower layer defined by N ($\geqq 2$) exposure steps and an upper layer defined by a lithography process, comprising:
  providing an overlay mark that comprises:
    four regions that are arranged in a 2×2 array, and include a first region and a second region arranged diagonally and a third region and a fourth region arranged diagonally;
    N sets of parallel x-directional linear patterns respectively defined by the N exposure steps and N sets of parallel y-directional linear patterns respectively defined by the N exposure steps; and
    a set of parallel x-directional photoresist bars and a set of parallel y-directional photoresist bars that are both formed in a lithography process, wherein the N sets of x-directional linear patterns and the set of x-directional photoresist bars are arranged in parallel, the N sets of y-directional linear patterns and the set of y-directional photoresist bars are arranged in parallel, each set of x-directional linear patterns includes a first part of x-directional linear patterns and a second part of x-directional linear patterns, each set of y-directional linear patterns includes a first part of y-directional linear patterns and a second part of y-directional linear patterns, the set of x-directional photoresist bars includes a first part of x-directional photoresist bars and a second part of x-directional photoresist bars, the set of y-directional photoresist bars includes a first part of y-directional photoresist bars and a second part of y-directional photoresist bars, the first parts of x-directional linear patterns of the N sets of x-directional linear patterns and the first part of x-directional photoresist bars are disposed in the first region, the second parts of x-directional linear patterns of the N sets of x-directional linear patterns and the second part of x-directional photoresist bars are disposed in the second region, the first parts of y-directional linear patterns of the N sets of y-directional linear patterns and the first part of y-directional photoresist bars are disposed in the third region, and the second parts of y-directional linear patterns of the N sets of y-directional linear patterns and the second part of y-directional photoresist bars are disposed in the fourth region;
  deriving, for each set of the N sets of x-directional linear patterns, the N sets of y-directional linear patterns, the set of x-directional photoresist bars and the set of y-directional photoresist bars, a central y- or x-coordinate as an average of y- or x-coordinates of the set of x- or y-directional linear patterns or photoresist bars; and
  comparing, for each pair of co-directional sets among all the sets of linear patterns and photoresist bars, respective central y- or x-coordinates of the co-directional sets to inspect a y- or x-directional local alignment between two portions of the lower layer respectively defined by two of the N exposure steps or between the upper layer and a portion of the lower layer defined by one of the N exposure steps.

9. The method of claim 8, wherein the N exposure steps belong to another lithography process.

10. The method of claim 9, wherein N is equal to 2 so that the N exposure steps constitute a double exposure process, or N is equal to 3.

11. The method of claim 8, wherein the N exposure steps respectively belong to N other lithography processes.

12. The method of claim 11, wherein N is equal to 2 or 3.

13. The method of claim 8, wherein deriving a central y- or x-coordinate of a set of x- or y-directional linear patterns or photoresist bars comprises:
  deriving a first average of y- or x-coordinates of the first part of the set of x- or y-directional linear patterns or photoresist bars as well as a second average of y- or x-coordinates of the second part of the set of x- or y-directional linear patterns or photoresist bars; and
  calculating an average of the first and the second averages as the central y- or x-coordinate.

14. A method of controlling overlay of an upper layer over a lower layer defined by a first exposure step and a second exposure step, comprising:
  checking overlay between the lower layer and the upper layer using a plurality of overlay marks, each of which comprises:
    a first set of parallel x-directional linear patterns, a first set of parallel y-directional linear patterns, a second set of parallel x-directional linear patterns and a second set of parallel y-directional linear patterns, wherein the first set of x-directional linear patterns and the first set of y-directional linear patterns are defined by the first exposure step and the second set of x-directional linear patterns and the second set of y-directional linear patterns defined by the second exposure step; and
    a set of parallel x-directional photoresist bars and a set of parallel y-directional photoresist bars that are both formed in a lithography process defining the upper layer, wherein the first set of x-directional linear patterns, the second set of x-directional linear patterns and the set of x-directional photoresist bars are arranged in parallel, and the first set of y-directional linear patterns, the second set of y-directional linear patterns and the set of y-directional photoresist bars are arranged in parallel,
  the checking comprising:
  deriving, for each overlay mark, a first central y-coordinate as an average of y-coordinates of the first set of x-directional linear patterns, a second central y-coordinate as an average of y-coordinates of the second set of x-directional linear patterns, a third central y-coordinate as an average of y-coordinates of the set of x-directional photoresist bars, a first central x-coordinate as an average of x-coordinates of the first set of y-directional linear patterns, a second central x-coordinate as an average of x-coordinates of the second set of y-directional linear patterns and a third central x-coordinate as an average of x-coordinates of the set of y-directional photoresist bars;
  calculating, for each overlay mark, a first difference between the first central y-coordinate and the third central y-coordinate, a second difference between the first central x-coordinate and the third central x-coordinate, a third difference between the second central y-coordinate and the third central y-coordinate and a fourth difference between the second central x-coordinate and the third central x-coordinate;
  deriving, from the first and the second differences of the overlay marks, a first set of overlay errors of multiple types between the upper layer and a portion of the lower layer defined by the first exposure step; and
  deriving, from the third and the fourth differences of the overlay marks, a second set of overlay errors of the multiple types between the upper layer and a portion of the lower layer defined by the second exposure step.

15. The method of claim 14, wherein in each pair of overlay errors of the same type in the first and second sets of overlay errors, a first overlay error correlated with the first exposure step can be compensated by a first compensation value C1 in a third exposure step belonging to the lithography process and a second overlay error correlated with the second exposure step can be compensated by a second compensation value C2 in the third exposure step, the method further comprising:

compensating each pair of overlay errors of the same type for the third exposure step, with a first weight "w" (w<1) and a second weight "(1−w)" respectively applied to the first compensation value C1 and to the second compensation value C2 so that a weighted compensation value of "C1×w+C2×(1−w)" is applied for the pair of overlay errors in the third exposure step.

16. The method of claim 15, wherein w is equal to 0.5.

17. The method of claim 15, wherein w is greater or less than 0.5.

18. The method of claim 14, wherein the first and the second exposure steps constitute a double exposure process in another lithography process.

19. The method of claim 14, wherein the first and the second exposure steps respectively belong to two other lithography processes.

* * * * *